United States Patent [19]

Miyazawa et al.

[11] Patent Number: 4,992,985

[45] Date of Patent: * Feb. 12, 1991

[54] METHOD FOR SELECTIVELY INITIATING/TERMINATING A TEST MODE IN AN ADDRESS MULTIPLEXED DRAM AND ADDRESS MULTIPLEXED DRAM HAVING SUCH A CAPABILITY

[75] Inventors: Kazuyuki Miyazawa, Iruma; Katsuhiro Shimohigashi, Musashimurayama; Jun Etoh, Hachiohji; Katsutaka Kimura, Sagamihara, all of Japan

[73] Assignee: Hitachi, Ltd., Tokyo, Japan

[ * ] Notice: The portion of the term of this patent subsequent to Mar. 7, 2006 has been disclaimed.

[21] Appl. No.: 319,693

[22] Filed: Mar. 7, 1989

Related U.S. Application Data

[62] Division of Ser. No. 41,070, Apr. 22, 1987, Pat. No. 4,811,299.

[30] Foreign Application Priority Data

Apr. 23, 1986 [JP] Japan .................................. 61-92056

[51] Int. Cl.$^5$ ................................................. G11C 7/00
[52] U.S. Cl. ..................................... 365/201; 365/200; 365/193; 365/230.02; 371/21.1
[58] Field of Search ............... 365/201, 193, 233, 200, 365/222, 189.04, 230.02; 371/10, 21.1, 24

[56] References Cited

U.S. PATENT DOCUMENTS

| | | | |
|---|---|---|---|
| 4,414,665 | 11/1983 | Kimura et al. ...................... | 365/201 |
| 4,482,985 | 4/1987 | Itoh et al. .............................. | 365/226 |
| 4,653,030 | 3/1987 | Tachibana et al. .................. | 365/233 |
| 4,656,610 | 4/1987 | Yoshida et al. .................. | 365/189.04 |
| 4,672,583 | 6/1987 | Nakaizumi ............................ | 371/21 |
| 4,752,914 | 6/1988 | Nakano et al. ...................... | 365/200 |
| 4,811,299 | 3/1989 | Miyazawa et al. ............. | 365/201 X |

OTHER PUBLICATIONS

Mitsubishi Giho, vol. 59, No. 9, Mitsubishi Electric Corp., 1985.

*Primary Examiner*—Joseph A. Popek
*Assistant Examiner*—Alfonso Garcia
*Attorney, Agent, or Firm*—Antonelli, Terry, Stout & Kraus

[57] ABSTRACT

An address multiplexed dynamic RAM device is provided which is capable of initiating (setting) and terminating (resetting) the test mode in response to the signal level combinations of the row address and column address strobe signals with the write enable signal, which signal level combinations correspond to those which are otherwise left unused in the normal operating mode thereby obviating the requirement of an additional external control signal terminal. Such initiating of the test mode can be effected by setting the $\overline{RAS}$ signal of the DRAM at a logic "low" level when the $\overline{CAS}$ signal and the $\overline{WE}$ signal are at a logic "low" level. Clearing or resetting thereof is effected by the same combination sequence, except that the $\overline{WE}$ signal is at a logic "high" level. The setting or initiating of a test mode is also implemented by the additional combination of one of the row address signal bits, e.g. the most significant bit.

33 Claims, 2 Drawing Sheets

METHOD FOR SELECTIVELY INITIATING/TERMINATING A TEST MODE IN AN ADDRESS MULTIPLEXED DRAM AND ADDRESS MULTIPLEXED DRAM HAVING SUCH A CAPABILITY

This is a divisional of application Ser. No. 041,070, filed Apr. 22, 1987, now U.S. Pat. No. 4,811,299.

BACKGROUND OF THE INVENTION

The present invention relates to a dynamic RAM (Random Access Memory) device and to the technology useful for fabricating a semiconductor memory with a storage capacity as large as 4 mega-bits.

Advanced semiconductor technology has enabled the development of a dynamic RAM as capacious as 1 megabits. RAM chips with such an increased storage capacity imposes an extended time period for testing. To cope with this matter, there is known a dynamic RAM chip which is provided therein with a test circuit, and is conducted in such a way wherein the same signal is written in different storage locations, each being a multiple of 4 bits, in the memory array and, if any one bit out of the signal retrieved from the memory array is inconsistent, the output terminal is brought to a high-impedance state. In the case where all bits of the read-out signal are high or low, the output terminal is enabled to output a high-level or low-level signal. (For details refer to the publication entitled "Mitsubishi Giho", Vol. 59, No. 9, published in 1985 by Mitsubishi Electric Corp.)

In the above test scheme, an unused pin on the 18-pin package is used to bring the RAM chip from the normal operating mode into the test mode in which the test circuit is activated. However, if a capacious dynamic RAM chip, e.g., a 4M bit RAM, is intended to be fabricated in conjunction with an 18-bit package, it uses up all spare pins to receive the address signal, and therefore the above-mentioned testing cannot be implemented.

SUMMARY OF THE INVENTION

It is an object of the present invention to provide a method wherein dynamic RAM device can be tested in a short period of time without having an increased number of external terminals.

The present invention typically resides in a method for effecting a test mode capability in a dynamic RAM and in a dynamic RAM device having the capability of being placed in a test mode phase or condition upon detection of a low binary level of both the column address strobe signal and write enable signal when the row address strobe signal is at a transitional logic state or level corresponding to a falling or trailing edge. Accordingly, the test mode can be selected by the combination of the existing external control signals used in the normal operation, whereby time expended for chip verification can be reduced without the need of an additional external terminal.

These and other objects and novel features of the present invention will become more apparent from the following detailed description taken in conjunction with the accompanying drawings.

DESCRIPTION OF THE PREFERRED EMBODIMENTS

Figure 2:
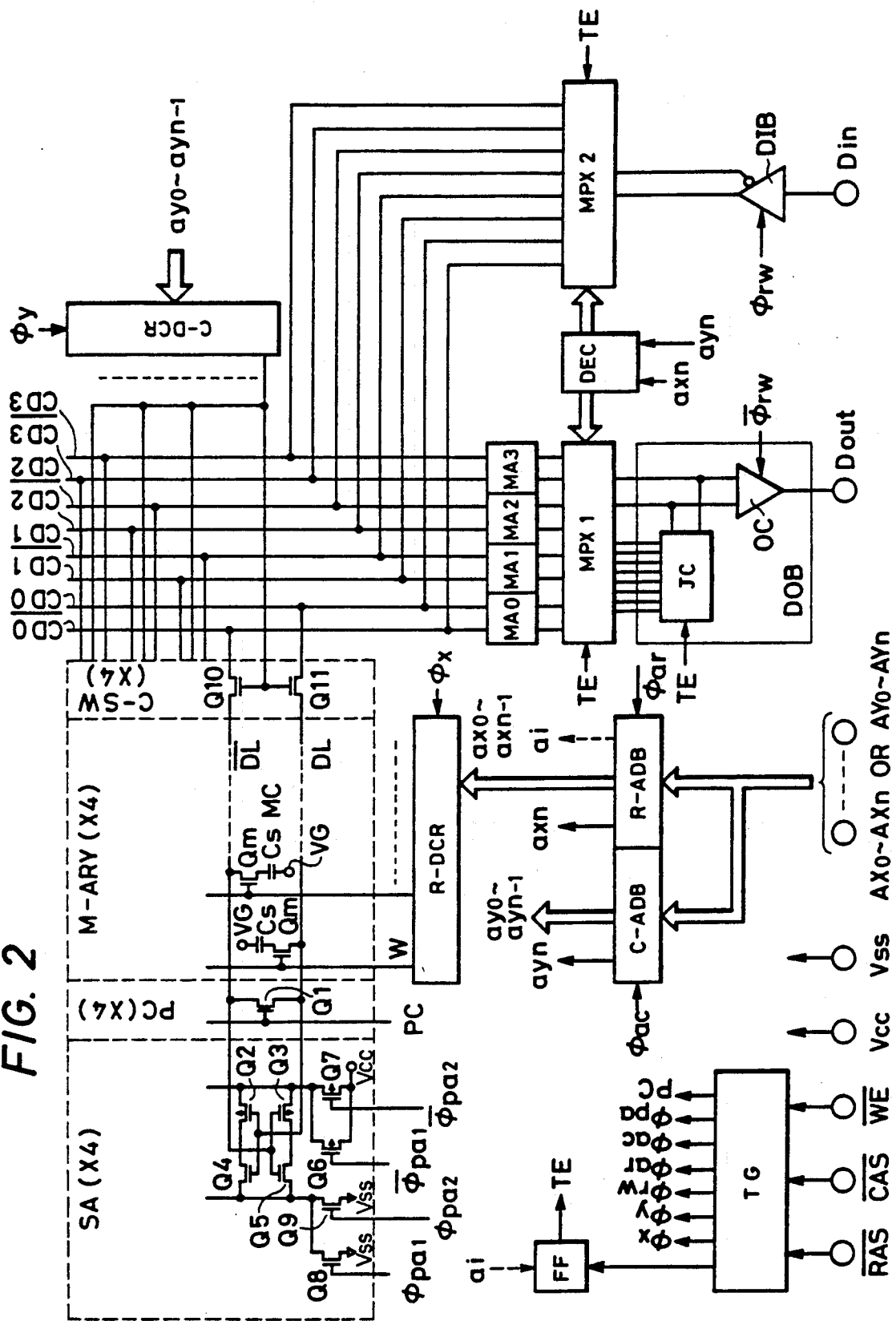
FIG. 2 is a block diagram of the dynamic RAM device embodying the present invention.

FIG. 2 shows in block diagram an embodiment of the inventive dynamic RAM device. All circuit elements and blocks shown in the figure are formed on a piece of semiconductor substrate, such as of p-type monocrystalline silicon for example, by a known CMOS (Complementary MOS FET) integrated circuit fabricating technique.

Each one bit memory cell (MC) of the RAM device consists of an information storage capacitor (Cs) and an n-channel MOS FET (Qm) for address selection connected in series to the capacitor. Logical data "1" or "0" is memorized in the form of charges stored in the capacitor Cs. The capacitor Cs has its one electrode applied with a fixed voltage VG (equal to half the Vcc).

Memory array M-ARY is of the folded bit line system, although this invention is not confined to it, and a pair of rows is shown in FIG. 2. A plurality of memory cells MC have their input/output nodes in a certain orderly arrangement coupled to a pair of complementary data lines DL and $\overline{DL}$ disposed in parallel.

Precharge circuit PC is formed of an n-channel switching MOS FET, shown by MOS FET Q1 as a typical case, disposed between the complementary data lines DL and $\overline{DL}$. Of the complementary data lines DL and $\overline{DL}$, one is brought to the supply voltage Vcc and the other to the ground voltage Vss by a sense amplifier SA as a result of the previous read or write cycle. Prior to the next access cycle, the complementary data lines DL and $\overline{DL}$ are short-circuited through the MOS FET Q1 in response to a "high" precharge signal PC produced by a timing generating circuit TG. Consequently, a precharge level Vcc/2 for the data lines DL and $\overline{DL}$ is attained.

The sense amplifier SA consists of p-channel MOS FETs Q2 and Q3 and n-channel MOS FETs Q4 and Q5 in this embodiment, i.e., it consists of a CMOS inverter made up of Q2 and Q4 and another CMOS inverter made up of Q3 and Q5, with their inputs and outputs coupled crisscross, to form a CMOS latch circuit, and its pair of input/output nodes are coupled to the complementary data lines DL and $\overline{DL}$. The latch circuit is supplied with the power voltage Vcc through parallel connected p-channel MOS FETs Q6 and Q7 and is also supplied with the ground voltage Vss through parallel connected n-channel MOS FETs Q8 and Q9. These power switching MOS FET pairs Q6–Q7 and Q8–Q9 are used commonly for other latch circuits provided on other rows in the same memory mat. In other words, p-channel MOS FETs and n-channel MOS FETs constituting latch circuits in the same memory mat have their source electrodes connected in common.

The MOS FETs Q8 and Q6 have their gates receiving complementary timing pulses $\phi pa1$ and $\overline{\phi}pa1$ for activating the sense amplifier SA in the operating cycle, while the MOS FETs Q9 and Q7 have their gates receiving complementary timing pulses $\phi pa2$ and $\overline{\phi}pa2$ that are the retarded versions of $\phi pa1$ and $\overline{\phi}pa1$. By this timing scheme, the sense amplifier SA operates in two stages. In the first stage when the timing pulses $\phi pa1$ and $\overline{\phi}pa1$ are applied, a small voltage read out of a memory cell to a pair of data lines is amplified without unwanted level fluctuation owing to the current limiting ability of the MOS FETs Q8 and Q6 having a relatively small conductance. After the difference of voltages on the complementary data lines has been made greater by the amplification of the sense amplifier SA, it enters the second stage in response to the generation of the timing pulses $\phi$pa2 and $\overline{\phi}$pa2, wherein the MOS FETs Q9 and Q7 which have a relatively large conductance are made conductive. The amplifying operation of the sense amplifier SA is speeded up by the transition of the MOS FETs Q9 and Q7 to the conductive state. Through the 2-stage amplifying operation of the sense amplifier SA, data can be read out quickly while at the same time being protected from unwanted voltage level fluctuation on the complementary data lines.

In the case where the voltage transferred by the memory cell MC to the data line DL is higher (or lower) than the precharge voltage Vcc/2, the sense amplifier SA brings data line DL to the power voltage Vcc (or ground voltage Vss). As a result of the differential amplification by the sense amplifier SA, the complementary data lines DL and $\overline{DL}$ will eventually have the power voltage Vcc and ground voltage Vss, respectively, or vice versa.

Row address decoder R-DCR decodes the internal complementary address signal ax0–axn−1 provided by a row address buffer R-ADB for implementing the word line selection in response to the word line select timing signal $\phi$x which is produced by a timing circuit TG described later.

The row address buffer R-ADB receives the row address signal AX0–AXn supplied on the external terminals A0–An in response to the timing signal $\phi$ar produced from the row address strobe signal $\overline{RAS}$ by the timing generating circuit TG. From the address signal AX0–AXn, the row address buffer R-ADB produces the internal address signal which is in phase with the address signal AX0–AXn and the internal address signal which is out of phase with AX0–AXn (these internal address signals will be termed comprehensively "internal complementary address signal ax0–axn", and this rule will be applied equally to other internal address signals in the following description and illustration).

Column switch C-SW consists of MOS FETs Q10 and Q11 in this embodiment, and it connects the complementary data lines DL and $\overline{DL}$ with common complementary data lines CD and $\overline{CD}$ selectively. The MOS FETs Q10 and Q11 have their gates receiving the select signals from a column decoder C-DCR. The column decoder C-DCR produces a data line select signal for selecting one data line and sends it to the column switch C-SW. The column address decoder C-DCR decodes the internal complementary address signal ay0–ayn−1 provided by a column address buffer C-ADB, which will be described later, and implements a certain data line selecting operation in response to the data line selection timing signal $\phi$y.

Column address buffer C-ADB takes the column address signal AY0–AYn on the external terminals A0–An in response to the timing signal $\phi$ac which is produced from the column address strobe signal $\overline{CAS}$ by the timing generating circuit TG. The column address buffer C-ADB produces the internal complementary address signal ay0–ayn from the address signal AY0–AYn.

The dynamic RAM device of this embodiment includes four memory arrays ARY, although the present invention is not limited to this number. Each memory array has a storage capacity of about 1M bits. Accordingly, the dynamic RAM of this embodiment has a total storage capacity as large as 4M bits. Four pairs of complementary data lines for the four memory arrays are grouped, and a data line select signal is alloted to these lines. The four pairs of complementary data lines are coupled through the column switch circuit C-SW to four pairs of common complementary data lines $\underline{CD0}$, $\underline{CD1}$, $\underline{CD2}$ and $\underline{CD3}$. It should be noted that a non-inverted common data line CD0 and inverted common data line $\overline{CD0}$ are expressed comprehensively as a common complementary data line $\underline{CD0}$.

The complementary address signals ax0–axn and ay0–ayn have a specific bit, e.g., the highest-order bits axn and ayn, fed to a decoder circuit DEC. The decoder circuit DEC produces from the bit signals axn and ayn the select signals to be given to multiplexers MPX1 and MPX2 in an input circuit and output circuit, respectively, for the signals described later.

The common complementary data lines $\underline{CD0}$–$\underline{CD3}$ are coupled to the input terminals of respective main amplifiers MA0–MA3, which amplify the signals on the common complementary data lines $\underline{CD0}$–$\underline{CD3}$ activated by a main amplifier operation timing signal (not shown) produced by the timing generating circuit TG. The main amplifiers MA0–MA3 have their complementary output signals selected by a multiplexer MPX1 which is controlled by the select signal provided by the decoder circuit DEC, and a selected amplifier output signal is delivered to the input terminal of a data output circuit DOB. In the normal operating mode with the test signal TE being a logic "low" level, the multiplexer MPX1 selects an output signal from among the main amplifiers MA0–MA3 in accordance with the output signal of the decoder circuit DEC. A complementary signal selected by the multiplexer MPX1 is delivered to the input terminal (an input terminal of the data output circuit DOB) of an output circuit OC which constitutes the data output circuit DOB. The output circuit OC is activated by the timing signal $\overline{\phi}$rw to amplify the input signal, and sends its output to an external terminal Dout for the bit-unit readout operation. The timing signal $\overline{\phi}$rw is produced by the timing control circuit TC during the read mode when the write enable signal $\overline{WE}$ is "high". During the write mode, the output of the output circuit OC, i.e., data output circuit DOB, is placed in a high impedance state by the signal $\overline{\phi}$rw.

The common complementary data lines $\underline{CD0}$–$\underline{CD3}$ are coupled to the output terminal of a data input circuit DIB through a multiplexer MPX2 which serves as an input selecting circuit. In the normal operating mode, the multiplexer MPX2 is controlled by the select signal produced by the decoder circuit DEC, and delivers the complementary output signal of the data input circuit DIB to a selected one of the common complementary data lines $\underline{CD0}$–$\underline{CD3}$. The data input circuit DIB is activated by the timing signal $\phi$rw, and delivers the input signal on the external terminal Din to a selected one of the common complementary data lines $\underline{CD0}$–$\underline{CD3}$ through the multiplexer MPX2 for the bit-unit write operation. The timing signal $\phi$rw is generated by the timing generating circuit TG with a certain delay following the main amplifier operation timing signal during the write mode when the write enable signal $\overline{WE}$ is "low". In the read mode, the output of the data input circuit DIB is placed in a high impedance state by the signal $\phi$rw.

The timing generating circuit TG produces the above-mentioned various timing signals necessary for the memory operation by receiving three external control signals $\overline{RAS}$ (row address strobe signal) $\overline{CAS}$ (column address strobe signal) and $\overline{WE}$ (write enable signal).

The dynamic RAM of this embodiment incorporates a test circuit in order to reduce time expended for verifying the capacious memory device. The test circuit on the part of data input is included in the multiplexer MPX2. In the test period or in the test mode when the test signal TE is "high", the test circuit enables all outputs of the multiplexer MPX2 to introduce the input signal on the external terminal Din onto the common complementary data lines $\overline{CD0}$–$\overline{CD3}$. Consequently, the same signal is written concurrently on selected four memory cells in the memory arrays M-ARY. Namely, a 4-bit data is thus written into the memory during the test mode.

The test circuit may be a switch circuit (e.g., MOS FET switch) provided in parallel to each unit circuit of the multiplexer MPX2, which is made conductive by a "high" test signal TE. Each unit circuit of the multiplexer MPX2 may be deactivated in the test mode.

The test circuit on the part of data output is included in the multiplexer MPX1 and data output circuit DOB. In the test period or in the test operation when the signal TE is "high", the test circuit in the multiplexer PX1 enables all outputs of the multiplexer MPX1 so that the output signals of the main amplifiers MA0–MA3 are introduced to a or determination circuit JC. The test circuit may be a switch circuit (e.g., MOS FET switch) provided in parallel to each unit circuit of the multiplexer MPX1, which is made conductive by a "high" test signal TE. In the test mode, each unit circuit of the multiplexer MPX1 is deactivated and its output to the output circuit OC is placed in a high impedance state.

The or determination circuit JC is a test circuit included in the data output circuit DOB, which also includes the data output circuit OC. The judgement or determination circuit JC is activated by the test signal TE. The circuit JC receives the output signals of the main amplifiers MA0–MA3 to detect (judge) as to whether there is consistency or inconsistency of the signals, and issues an output signal, depending on the detection result, to the external terminal Dout by way of the output circuit OC. Accordingly, the circuit apparently operates such that it reads 4-bit data during the test mode The judgement or determination circuit JC is configured by exclusive-OR (or NOR) circuits, for example. The outputs of the main amplifiers MA0 and MA1 and the outputs of the main amplifiers MA2 and MA3 are compared by first and second exclusive-OR circuits, which have their outputs compared with each other by a third exclusive-OR circuit. The judgement or determination circuit JC issues an output signal based on the output of the third exclusive-OR circuit to the output circuit OC. Consequently, the output circuit OC produces a "high" or "low" output signal when all of the 4-bit readout signals from the main amplifiers MA0--MA3 are either at a logic "high" or logic "low" level, respectively. Of the 4-bit readout signals, if any bit is inconsistent with the others, the output terminal Dout is brought to a high impedance state.

In case of a fault or error wherein stored data of all 4-bit memory cells are reversed, the output circuit OC issues a "high" or "low" output as if no fault or error has occurred. On this account, it is desirable for the tester to hold input data according to the expected value and to compare the readout signal with the expected value.

Activation and deactivation of the test circuit is controlled by the test signal TE provided by a latch circuit FF which is set or reset by the operating mode identification output from the timing generating circuit TG. For example, when the test signal TE is "high", each test circuit is activated, and when the test signal is "low", the test circuit is deactivated. Switching of the test mode and normal mode takes place in this way.

Figure 1:
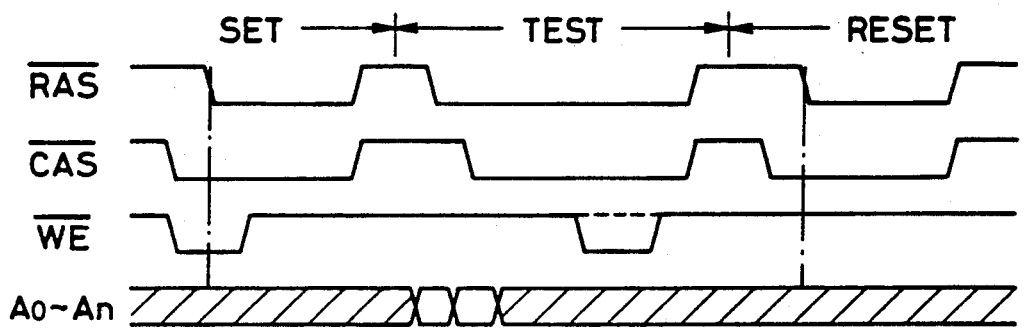
FIG. 1 is a timing chart used to explain an embodiment of this invention.

Activation and deactivation of the test circuit will further be described with reference to the timing chart shown in FIG. 1.

At the transitional logic level corresponding to the trailing or falling edge of the row address strobe signal $\overline{RAS}$, the column address strobe signal $\overline{CAS}$ and write enable signal $\overline{WE}$ are respectively at a logic level "low". In response to this transition, the timing generating circuit TG sends a "high" signal to the latch circuit FF. Then, the latch circuit FF is set to produce a "high" test signal TE. Namely, this memory cycle implements only the setting of the test mode.

For example, when the dynamic RAM incorporates an automatic refreshing circuit of the type of CAS-before-RAS refreshing, the refreshing operation takes place concurrently with the setting of the test mode on the basis of the relation between the address strobe signals $\overline{RAS}$ and $\overline{CAS}$. Such a concurrent occurrence of test mode setting and refreshing may be avoided by disabling the refresh mode using a "low" write enable signal $\overline{WE}$.

For the write/read operation in the actual testing, the $\overline{RAS}$ and $\overline{CAS}$ signals are once brought to "high" to reset the dynamic RAM. This is followed by the read/write operation in the normal mode. With the row address strobe signal $\overline{RAS}$ being placed "low", a row address signal AX0-Axn is taken in, and thereafter with the column address signal $\overline{CAS}$ being placed "low", a column address signal AY is taken in. Following the signal $\phi ar$, signals $\phi x$, $\phi pa$ ($\phi pa1$, $\overline{\phi}pa1$, $\phi pa2$ and $\overline{\phi}pa2$) and main amplifier operation signal are produced at a certain timing relationship. Signal $\phi y$ is produced following signal $\phi ac$. As a result, four memory cells corresponding to address signals ax0-axn−1 and ay0-ayn−1 are connected to the common data lines $\overline{CD0}$–$\overline{CD3}$.

At this time, for writing test data, the write enable signal $\overline{WE}$ is made "low" at the timing shown in the figure. Consequently, the generated signals $\phi rw$ and $\overline{\phi}rw$ make the data input circuit DIB active and the output circuit OC inactive. Since the test signal TE is "high", a complementary signal supplied at the external terminal Din is introduced by way of the data input circuit DIB and whole-enabled multiplexer MPX2 to the common data lines $\overline{CD0}$–$\overline{CD3}$. As a result, a piece of data is written in the four memory cells, i.e., apparent 4-bit writing takes place. A pair of complementary signals processed by the main amplifier have a voltage difference of about 200 mV, for example, and that of the outputs of the data input circuit DIB is as large as about 5 volts. On this account, data on the external terminal Din is written into memory cells irrespective of the operation of the main amplifier.

Subsequently, test data which has been written in the memory cells is read out. In the same way as described above, four memory cells corresponding to the address signal ax0-axn−1 and ay0-ayn−1 are connected to the common data lines CD0–CD3 in the normal mode. At this time, for reading out test data, the write enable signal $\overline{WE}$ is made "high" as shown by the dashed line in FIG. 1. Consequently, the generated signals $\overline{\phi}rw$ and $\phi rw$ make the data input circuit DIB inactive and the output circuit OC active. Since the test signal TE is "high", the multiplexer MPX1 delivers the output signals of the main amplifiers MA0–MA3 to the judgement or determination circuit JC, and at the same time a selected output is brought to a high impedance state. In response to the "high" test signal TE, the judgement circuit tests whether or not the 4-bit signals are consistent, i.e. in agreement. The output circuit OC responds to the result determined by the judgement circuit so as to bring the external terminal Dout to a logic "high", a logic "low" or to a high impedance state, accordingly. Thus, apparent 4-bit data reading takes place. It is thus possible to determine the presence of a defective bit in the selected four memory cells.

The memory test with the test signal TE being "high" can be cycled without lowering the test signal TE each time, although this invention is not confined to this scheme. Reading may take place repeatedly following the 4-bit writing of test data. After writing test data in all bits or all bits of one memory array, the bit data may be read out.

On completion of the test, the test mode is terminated. In order for this operation to take place, the column address strobe $\overline{CAS}$ and write enable signal $\overline{WE}$ are made "low" and "high", respectively, at the falling edge of the row address strobe signal $\overline{RAS}$. In response to this transition, the timing generating circuit TG sends a "low" signal to the latch circuit FF. Then, the latch circuit FF is set, and the test signal TE is made "low". In this memory cycle RESET, only cancellation of the test mode takes place.

For example, when the dynamic RAM incorporates an automatic refreshing circuit of the type of CAS-before-RAS refreshing, the refreshing operation takes place concurrently with the test mode cancellation on the basis of the relationship between the address strobe signals $\overline{RAS}$ and $\overline{CAS}$.

Accordingly, the test signal TE can be made "low", and the following operation can take place in the normal mode. On this account, the $\overline{RAS}$ and $\overline{CAS}$ signals are made "high", and the dynamic RAM is reset.

The effectiveness achieved by the foregoing embodiment is as follows.

(1) By the combinations of the row address and column address strobe signals with the write enable signal, which combinations are unused in the normal mode, the test mode can be initiated and cancelled without increasing the number of external control signals.

(2) Accordingly, a dynamic RAM as capacious as 4M bits can be accommodated in a 18-pin package. This enables matching with a 1M-bit dynamic RAM, while attaching the test function.

Although the present invention has been described with respect to a specific embodiment, the invention is not to be construed as being confined to this embodiment only because various changes are of course possible without departing from the spirit and scope thereof. For example, the address signal may be added to the combinations of the signals $\overline{RAS}$, $\overline{CAS}$ and $\overline{WE}$ for the setting and cancellation of the test mode.

Figure 3:
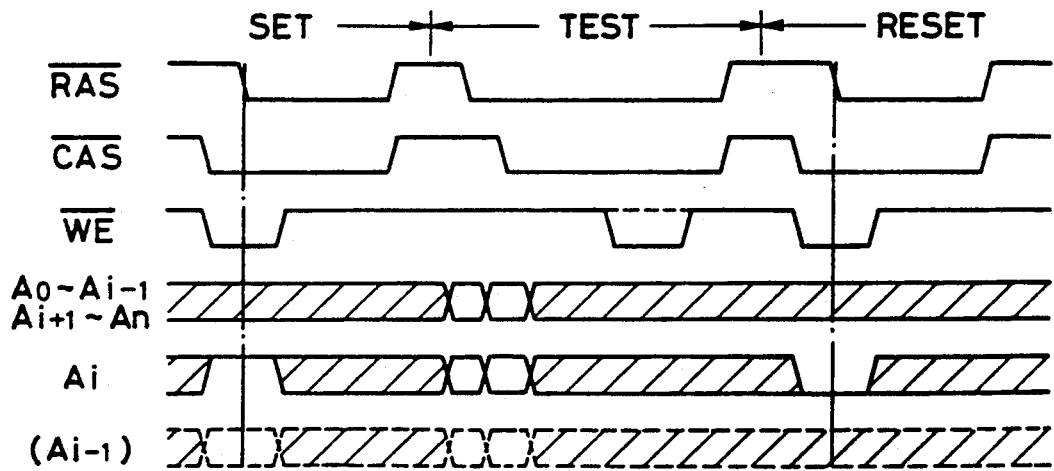
FIG. 3 is a timing chart used to explain another embodiment of this invention.

As shown by the dashed line in FIG. 2, the latch circuit FF receives a signal ai through a specific external address input terminal Ai. The timing generating circuit TG produces a one-shot pulse in response to a "low" column address strobe signal $\overline{CAS}$ and write enable signal $\overline{WE}$ at transitional falling edge of the row address strobe signal $\overline{RAS}$. The latch circuit FF responds to this one-shot pulse to take a signal at a then specific address terminal. For example, when address terminal Ai provides a "high" signal, as shown in FIG. 3, the test mode is set, i.e., the test signal TE is made "high". The signal ai is supplied from the row address buffer R-ADB, although the present invention is not confined to this scheme.

On completion of the memory cycle SET for setting the test mode, the test cycle TEST is repeated. After the test, the memory cycle RESET for cancelling the test mode is carried out as follows. The timing generating circuit TG produces a one-shot pulse depending on the combination of the signals $\overline{RAS}$, $\overline{CAS}$ and $\overline{WE}$, as used in the memory cycle SET, as shown in FIG. 3. The latch circuit FF responds to this one-shot pulse to take a "low" signal on the address terminal Ai. Consequently, the test signal is made "low", and the test mode is cancelled.

Besides the initiation and cancellation of the test mode, it is also possible to provide the data output circuit DOB with a function of outputting the inconsistency output signal in terms of a selected mode defined by a high impedance state and an intermediate signal level condition (mid-point voltage ½ Vcc between the power voltage Vcc and ground voltage Vss), and operate the circuit DOB so that one such mode is selected. By the addition of the above function, the inconsistency output signal can be switched depending on the tester used. For example, with the dynamic RAM mounted on a memory board, the output terminal Dout is connected in a wired-OR configuration by the data bus on the board. Since the data bus still retains the signal of the previous operating cycle, the inconsistency output signal in the high-impedance output mode makes identification difficult. In such a case, the signal can be switched to the intermediate-level output mode for testing a dynamic RAM on the memory board.

Selection of the output mode can be accomplished using the address signal. In the memory cycle SET in FIG. 3, the signal (address signal) received on the external terminal Ai-1, as shown by the dashed line, is latched in a latch circuit (not shown). The signal on the external terminal Ai-1 is made effective only when the signal on the external terminal Ai is "high" during the memory cycles SET and RESET. When the latch circuit provides a "high" or "low" output, the output circuit OC brings the inconsistency signal to the high-impedance or intermediate level, respectively.

In case the output circuit OC has its final output stage made up of first and second MOS FETs connected between the power voltage Vcc and external terminal Dout and between the ground voltage Vss and external terminal Dout, the selection of output mode of the data output circuit DOB takes place as follows.

In the normal output mode, the first circuit in the output circuit OC supplies complementary signals to the gates of the first and second MOS FETs. The first circuit is activated or deactivated in response to a "low" or "high" test signal TE, respectively. When outputting the inconsistency signal ("high" or "low") in the test mode, the second circuit in the output circuit OC supplies complementary signals to the gates of the first and second MOS FETs. The output circuit OC further includes third and fourth circuits for the inconsistency output in the test mode. Upon receiving the inconsistency signal, the third circuit supplies a "low" signal to the gate of the first and second MOS FETs. Then, the two MOS FETs are cut off, and the external terminal Dout is rendered in a high impedance state condition. The fourth circuit, upon receiving the inconsistency signal, supplies a "high" signal to the gates of the first and second MOS FETS. Then the two output MOS FETs become conductive, causing the external terminal Dout to have a voltage depending on the conductance (gm) of the two MOS FETs, e.g., ½ Vcc.

In practice, each pair of the second and third circuits and the second and fourth circuits is constructed in a unitary circuit. When the test signal TE is "high", one of these signals is made active by the signal on the external terminal Ai−1.

The address terminal Ai is the highest-order bit of the address signal, e.g., terminal A10 for a 1M-bit RAM. In this embodiment, the terminal Ai is terminal An for the internal signal axn. This terminal designation facilitates the alteration of the chip function. For example, when a 1M-bit RAM chip is configured in 256K words by 4 bits, the terminal A10 is rendered unnecessary. By application of this invention to this case, no change is required for the terminal A10, and it can be used exclusively for mode setting.

The output mode may be selected depending on the signal on terminal Ai−1 as follows. On reception of a "high" signal on the terminal Ai−1, any of "high", "low" and high impedance (or intermediate level) signal is supplied to the external terminal Dout. With a "low" signal being given, a "high" signal and a "low" signal are supplied as the consistency signal and inconsistency signal, respectively, to the external terminal Dout.

By combining the address signal with the row address strobe signal, column address strobe signal and write enable signal, test mode initiation and cancellation can be simplified, and a test function with multiple modes can be added.

Instead of the address terminals Ai and Ai−1, the input terminal Din or output terminal Dout may be used. Cancellation of the test mode may take place in 15 response to the sole transition of the RAS signal to "low" in one memory cycle.

The latch circuit FF may be constructed by a binary counter circuit using master-slave flip-flops. The counter circuit operates in response to a one-shot pulse produced by the timing generating circuit TG by placing the column address strobe signal CAS and write enable signal WE at "low" level at the falling edge of the row address strobe signal RAS. Depending on the output of the counter circuit, either the test mode or normal mode is selected. Preferably, the counter circuit is designed so that the RAM chip is set to the test mode or normal mode invariably when power is turned on.

The dynamic RAM to which this invention is applied may be one having a nibble mode function in which a signal with multiple bits read out in parallel from the memory array is outputted in a serial fashion in response to a signal which alternates in synchronism with the column address strobe signal. In this case, the address signal supplied to the decoder circuit DEC in FIG. 2 is controlled by a shift register or address counter circuit. The memory array M-ARY may be constructed with a reduced number of memory cells coupled with the word lines and/or data lines, and in the form of multiple memory mats so as to speedup and enhance the level margin of the signals read out of the memory cells.

The number of memory cells selected by addressing of memory array, in other words the number of common complementary data lines, may take any value larger than one, such as 8 bits and 16 bits in addition to the foregoing case of 4 bits. Moreover, if some pins are left unused when the present invention is applied to a dynamic RAM having a storage capacity of 1M bits or 256K bits, they may be used for other operating modes. The present invention can be used extensively for dynamic RAM devices incorporating a test circuit.

What is claimed is:

1. A method of entering into a test mode from a normal operation mode in an address multiplexed dynamic RAM having at least a first external terminal for receiving a row address strobe signal, a second external terminal for receiving a column address strobe signal and a third external terminal for receiving a write enable signal, comprising the steps of:
   (a) setting said column address strobe signal at a logic "low" level;
   (b) setting said write enable signal at a logic "low" level; and
   (c) setting said row address strobe signal at a logic "low" level subsequent to said steps (a) and (b).

2. A method according to claim 1, further including the step of:
   (d) setting an address signal, received at a fourth external terminal of said dynamic RAM, at a predetermined logic level before the time wherein said step (c) is performed.

3. A method according to claim 2, wherein said address signal is a row address signal.

4. A method according to claim 3, wherein said row address signal is the most significant bit of a multi-bit address.

5. A method according to claim 4, wherein said most significant bit is an address A10 of an address including bits having an order of significance A1-A10.

6. A method of returning to a normal operation state from a test mode in an address mutiplexed dynamic RAM having at least a first external terminal for receiving a row address strobe signal, a second external terminal for receiving a column address strobe signal and a third external terminal for receiving a write enable signal, comprising the steps of:
   (a) setting said column address strobe signal at a logic "low" level;
   (b) setting said write enable signal at a logic "high" level; and
   (c) setting said row address strobe signal at a logic "low" level subsequent to said steps (a) and (b).

7. A method according to claim 6, further including the step of:
   (d) setting an address signal, received at a fourth external terminal of said dynamic RAM, at a predetermined logic level before the time wherein said step (c) is performed.

8. A method according to claim 7, wherein said address signal is a row address signal.

9. A method according to claim 8, wherein said row address signal is the most significant bit of a multi-bit address.

10. A method according to claim 9, wherein said most significant bit is an address A10 of an address including bits having an order of significance A1-A10.

11. A method of selecting one of test modes in an address multiplexed dynamic RAM having at least a first external terminal for receiving a row address strobe signal, a second external terminal for receiving a column address strobe signal, a third external terminal for receiving a write enable signal and a fourth external terminal for receiving an address signal, comprising the steps of:
   (a) setting said column address strobe signal at a logic "low" level;
   (b) setting said write enable signal at a logic "low" level;
   (c) setting said row address strobe signal at a logic "low" level subsequent to said steps (a) and (b); and
   (d) designating a test mode for said dynamic RAM in response to said address signal being at a predetermined logic level at the time that said step (c) is performed.

12. A method according to claim 11, wherein said address signal is a row address signal.

13. A method according to claim 12, wherein said row address signal is the most significant bit of a multi-bit address.

14. A method according to claim 13, wherein said most significant bit is an address A10 of an address including bits having an order of significance A1–A10.

15. An address multiplexed dynamic RAM having both a normal operational mode and a test mode comprising:
   a first external terminal for receiving a row address strobe signal;
   a second external terminal for receiving a column address strobe signal; and
   a third external terminal for receiving a write enable signal,
   wherein said test mode is initiated in response to said column address strobe signal being at a logic "low" level and said write enable signal being at a logic "low" level when said row address strobe signal is at a transitional logic level corresponding to a falling edge.

16. An address multiplexed dynamic RAM according to claim 15, wherein said test mode is cleared and said dynamic RAM is returned to said normal operation state in response to said column address strobe signal being at a logic "low" level and said write enable signal being at a logic "high" level when said row address strobe signal is at a transitional logic level corresponding to a falling edge.

17. An address multiplexed dynamic RAM having both a normal operational mode and a test mode comprising:
   a first external terminal for receiving a row address strobe signal;
   a second external terminal for receiving a column address strobe signal;
   a third external terminal for receiving a write enable signal; and
   a fourth external terminal for receiving a first address signal and a second address signal,
   wherein said test mode is initiated in response to said column address strobe signal being at a logic "low" level, said write enable signal being at a logic "low" level and said first address signal being at a first predetermined logic level when said row address strobe signal is at a transitional logic level corresponding to a falling edge.

18. An address multiplexed dynamic RAM according to claim 17, wherein said test mode is cleared and said dynamic RAM is returned to its normal operation state in response to said column address strobe signal being at a logic "low" level, said write enable signal being at a logic "high" level and said second address signal being at a second predetermined logic level, different from said first predetermined logic level, when said row address strobe signal is at a transitional logic level corresponding to a falling edge.

19. An address multiplexed dynamic RAM according to claim 18, wherein said fourth external terminal is an address terminal for receiving the most significant bit of a multi-bit address.

20. An address multiplexed dynamic RAM according to claim 19, wherein said fourth external terminal receives the most significant bit A10 of an address including bits having an order of significance A1–A10.

21. A method of entering into a test mode in an address multiplexed dynamic RAM having a first external terminal for receiving a row address strobe ($\overline{RAS}$) signal, a second external terminal for receiving a column address strobe ($\overline{CAS}$) signal and a third external terminal for receiving a write enable signal, comprising the steps of:
   setting said $\overline{CAS}$ signal at a logic "low" level;
   setting said write enable signal at a logic "low" level; and
   setting said $\overline{RAS}$ signal at a logic "low" level when said $\overline{CAS}$ signal and said write enable signal are at a logic "low" level.

22. A method according to claim 21, further including the step of:
   setting an address bit, received at a fourth external terminal of said dynamic RAM, at a predetermined logic level before the time wherein said step of setting said $\overline{RAS}$ signal at a logic "low" level.

23. A method according to claim 22, wherein said address bit is a row address bit.

24. A method of returning to a normal operation state from a test mode in an address multiplexed dynamic RAM having a first external terminal for receiving a row address strobe ($\overline{RAS}$) signal, a second external terminal for receiving a column address strobe ($\overline{CAS}$) signal and a third external terminal for receiving a write enable signal, comprising the steps of:
   setting said $\overline{CAS}$ signal at a logic "low" level;
   setting said write enable signal at a logic "high" level; and
   setting said $\overline{RAS}$ signal at a logic "low" level when said $\overline{CAS}$ signal is at a logic "low" level and said write enable signal is at a logic "high" level.

25. A method of selecting one of test modes in an address multiplexed dynamic RAM having a first external terminal for receiving a row address strobe ($\overline{RAS}$) signal, a second external for receiving a column address strobe ($\overline{CAS}$) signal, a third external terminal for receiving a write enable signal and a fourth external terminal for receiving an address signal bit, comprising the steps of:
   setting said $\overline{CAS}$ signal at a logic "low" level;
   setting said write enable signal at a logic "low" level; and
   setting said $\overline{RAS}$ signal at a logic "low" level when said $\overline{CAS}$ signal and said write enable signal are at a logic "low" level designating a test mode in response to a predetermined logic state of said address bit at the time that said step of setting said $\overline{RAS}$ signal at a logic "low" level is effected.

26. A method according to claim 25, wherein said address signal bit is a row address bit.

27. A method according to claim 26, wherein said row address signal bit is the most significant bit of said row address signal.

28. An address multiplexed dynamic RAM having a normal operation mode and a test mode comprising:
   a first external terminal for receiving a row address strobe ($\overline{RAS}$) signal;
   a second external terminal for receiving a column address strobe ($\overline{CAS}$) signal;
   a third external terminal for receiving a write enable signal; and
   wherein said test mode is initiated in response to setting said $\overline{RAS}$ signal at a logic "low" level when said $\overline{CAS}$ signal is at a logic "low" level and said write enable signal is at a logic "low" level.

29. An address multiplexed dynamic RAM according to claim 28, wherein said test mode is cleared in response to setting said $\overline{RAS}$ signal at a logic "low" level when said $\overline{CAS}$ signal is at a logic "low" level and said write enable signal is at a logic "high" level.

30. An address multiplexed dynamic RAM according to claim 28, wherein said test mode is cleared in response to setting said $\overline{RAS}$ signal at a logic "low" level when said $\overline{CAS}$ signal is at a logic "high" level and said write enable signal is at a logic "high" level.

31. An address multiplexed dynamic RAM according to claim 28, further comprising:
   a fourth external terminal for receiving an address bit, wherein
   one of test modes is selected based on the logic state of said address bit at the time that said test mode initiating sequence of said $\overline{RAS}$, $\overline{CAS}$ and write enable signals is provided.

32. An address multiplexed dynamic RAM according to claim 28, further comprising:
   test means for writing data having the same value to the selected memory cells, verifying as to whether or not data which is read out of the selected memory cells are in agreement with predetermined data and providing a resultant verification output.

33. An address multiplexed dynamic RAM according to claim 32, said test means further comprising:
   selecting means for selecting multiple ones of said memory cells in accordance with an address signal which is synchronized with said $\overline{RAS}$ signal and in accordance with an address signal which is synchronized with said $\overline{CAS}$ signal.

* * * * *